(12) United States Patent
Adam et al.

(10) Patent No.: US 9,059,207 B2
(45) Date of Patent: Jun. 16, 2015

(54) STRAINED CHANNEL FOR DEPLETED CHANNEL SEMICONDUCTOR DEVICES

(75) Inventors: Thomas N. Adam, Slingerlands, NY (US); Kangguo Cheng, Guilderland, NY (US); Ali Khakifirooz, Slingerlands, NY (US); Alexander Reznicek, Mount Kisco, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 13/613,747

(22) Filed: Sep. 13, 2012

(65) Prior Publication Data

US 2013/0200433 A1     Aug. 8, 2013

Related U.S. Application Data

(63) Continuation of application No. 13/364,850, filed on Feb. 2, 2012, now abandoned.

(51) Int. Cl.
*H01L 29/66*      (2006.01)
*H01L 29/78*      (2006.01)
*H01L 29/786*    (2006.01)

(52) U.S. Cl.
CPC .... *H01L 29/66545* (2013.01); *H01L 29/66772* (2013.01); *H01L 29/66795* (2013.01); *H01L 29/785* (2013.01); *H01L 29/78687* (2013.01)

(58) Field of Classification Search
CPC ............ H01L 29/785; H01L 29/66795; H01L 21/845
USPC ................................................ 257/190, 347
See application file for complete search history.

(56) References Cited

U.S. PATENT DOCUMENTS

| | | | |
|---|---|---|---|
| 6,083,836 A | 7/2000 | Rodder | |
| 7,410,854 B2 * | 8/2008 | Yao et al. | 438/197 |
| 7,572,712 B2 | 8/2009 | Chong et al. | |

(Continued)

FOREIGN PATENT DOCUMENTS

| | | |
|---|---|---|
| CN | 101136434 A | 3/2008 |
| CN | 101681821 A | 3/2010 |
| JP | 2008135567 | 6/2008 |

OTHER PUBLICATIONS

U.S. Office Action dated Aug. 6, 2013 issued in related U.S. Appl. No. 13/364,850.

(Continued)

*Primary Examiner* — Kevin Parendo
(74) *Attorney, Agent, or Firm* — Scully, Scott, Murphy & Presser, P.C.; Daniel P. Morris, Esq.

(57) ABSTRACT

A planar semiconductor device including a semiconductor on insulator (SOI) substrate with source and drain portions having a thickness of less than 10 nm that are separated by a multi-layered strained channel. The multi-layer strained channel of the SOI layer includes a first layer with a first lattice dimension that is present on the buried dielectric layer of the SOI substrate, and a second layer of a second lattice dimension that is in direct contact with the first layer of the multi-layer strained channel portion. A functional gate structure is present on the multi-layer strained channel portion of the SOI substrate. The semiconductor device having the multi-layered channel may also be a finFET semiconductor device.

17 Claims, 5 Drawing Sheets

(56) References Cited

U.S. PATENT DOCUMENTS

| | | |
|---|---|---|
| 7,687,356 B2 | 3/2010 | Coronel et al. |
| 7,960,243 B2 | 6/2011 | Winstead et al. |
| 2005/0130358 A1* | 6/2005 | Chidambarrao et al. ..... 438/197 |
| 2006/0071275 A1* | 4/2006 | Brask et al. ................... 257/350 |
| 2006/0292762 A1 | 12/2006 | Borland et al. |
| 2007/0266933 A1 | 11/2007 | Tsuchiya et al. |
| 2008/0054301 A1 | 3/2008 | Wang et al. |
| 2008/0265280 A1* | 10/2008 | Currie .......................... 257/190 |
| 2011/0073961 A1 | 3/2011 | Dennard et al. |
| 2011/0115023 A1 | 5/2011 | Cheng et al. |
| 2011/0121370 A1 | 5/2011 | Guo et al. |
| 2012/0025266 A1 | 2/2012 | Griebenow et al. |
| 2013/0161693 A1* | 6/2013 | Adam et al. .................. 257/192 |

OTHER PUBLICATIONS

Munehisa Takei, et al., Channel strain analysis in high-performance damascene-gate p-metal-oxide-semiconductor field effect transistors using high-spatial resolution Raman spectroscopy, Journal of Applied Physics, Jun. 2010, vol. 107.

* cited by examiner

STRAINED CHANNEL FOR DEPLETED CHANNEL SEMICONDUCTOR DEVICES

CROSS REFERENCE TO RELATED APPLICATION

This application is a continuation of U.S. patent application Ser. No. 13/364,850, filed Feb. 2, 2012, the entire content and disclosure of which is incorporated herein by reference.

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

A method of fabricating a semiconductor device is provided that, in one embodiment, may begin with providing a replacement gate structure on a channel portion of a semiconductor on insulator (SOI) layer of a semiconductor on insulator (SOI) substrate. The SOI layer has a first thickness of less than 10 nm. Raised source and drain regions are present on opposing sides of the replacement gate structure. The replacement gate structure is removed to expose the channel portion of the SOI layer of the SOI substrate. The channel portion of the SOI layer is then etched to have a second thickness that is less than the first thickness. An epitaxially grown semiconductor layer is then deposited on the channel portion of the SOI layer having the second thickness. The lattice dimension of the epitaxially grown semiconductor layer is selected to be different from the lattice dimension of the channel portion of the SOI layer to provide a strained channel. A functional gate structure is then formed on the strained channel. In another aspect of the present disclosure, a planar semiconductor device is provided having a strained channel that is fully depleted. In one embodiment, the planar semiconductor device includes a semiconductor on insulator (SOI) substrate including a semiconductor on insulator (SOI) layer with source and drain portions having a thickness of less than 10 nm that are separated by a fully depleted multi-layered strained channel. The fully depleted multi-layer strained channel of the SOI layer includes a first layer with a first lattice dimension that is present on a buried dielectric layer of the SOI substrate, and a second layer of a second lattice dimension that is in direct contact with the first layer of the multi-layer strained channel. A functional gate structure is present on the fully depleted multi-layered strained channel.

In yet another aspect of the present disclosure, a method of forming a fin field effect transistor (finFET) is provided. In one embodiment, the method of forming the finFET includes providing at least one fin structure having a first width of less than 20 nm, wherein the at least one fin structure is composed of a first semiconductor material. A replacement structure is formed atop a channel portion of the at least one fin structure. Source and drain regions may be formed on the exposed sidewalls of the at least one fin structure on each side of the replacement gate structure. The replacement gate structure is then removed to expose the channel portion of the at least one fin structure. The channel portion of the at least one fin structure is then etched to have a second width that is less than the first width. An epitaxially grown semiconductor layer is then deposited on the channel portion of at least one fin structure having the second width. The lattice dimension of the epitaxially grown semiconductor layer is different than the lattice dimension of the channel portion of the at least one fin structure to provide a strained channel. A functional gate structure is then formed on the strained channel.

In a further aspect of the present disclosure, a fin field effect transistor (finFET) is provided that includes a fin structure with source and drain portions of a first semiconductor material having a thickness of less than 10 nm, wherein the source and drain portions of the fin structure are separated from one another by a fully depleted multi-layered strained channel. The fully depleted multi-layer strained channel of the fin structure includes a first layer of the first semiconductor material and a second layer of a second semiconductor that is in direct contact with the first layer. The first semiconductor material has a different lattice dimension than the lattice dimension of the second semiconductor material. A functional gate structure is present in direct contact with the second layer of the fully depleted multi-layer strained channel of the fin structure.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Figure 1:
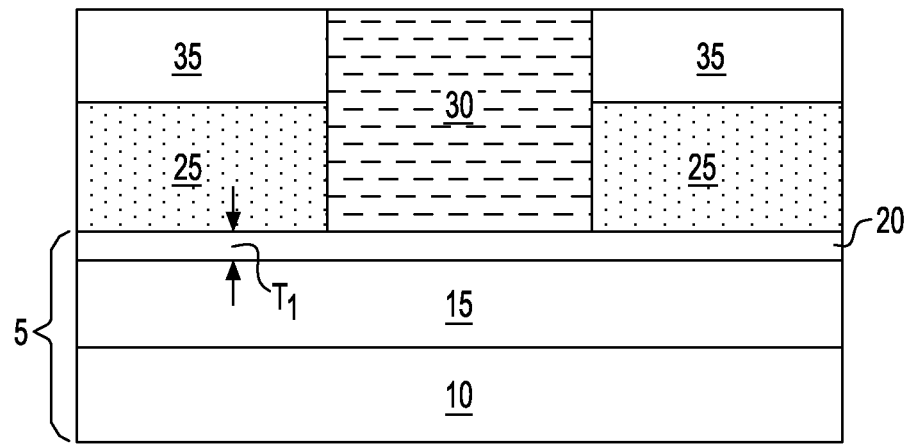
FIG. 1 is a side cross-sectional view depicting forming a replacement gate structure on an extremely thin semiconductor on insulator (ETSOI) substrate as used in one embodiment of a method of forming a planar semiconductor device in accordance with the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. References in the specification to "one embodiment", "an embodiment", "an example embodiment", etc., indicate that the embodiment described may include a particular feature, structure, or characteristic, but every embodiment may not necessarily include the particular feature, structure, or characteristic.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawing figures. The terms "overlying", or "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

Increased charge carrier speed may be achieved using strain based performance enhancements in semiconductor devices. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Introducing strain to portions of the semiconductor device increase the charge carrier speed within the semiconductor device, therefore increasing the speed of the semiconductor device.

It has been determined that with further scaling of semiconductor devices and implementation of fully depleted semiconductor devices, that forming stressor wells within the source and drain regions of the semiconductor devices does not provide the desired strain based performance enhancements. Further, stress liners formed overlying semiconductor devices provide diminishing performance benefit with increasingly scaled pitch. In one embodiment, the methods and structures disclosed herein provide enhanced device performance for semiconductor devices formed on ETSOI substrates with fully depleted channel regions by employing a strained channel.

The term "extremely thin semiconductor on insulator (ET-SOI) substrate" denotes a semiconductor on insulator (SOI) substrate, in which the semiconductor on insulator (SOI) layer (hereafter referred to as "extremely thin semiconductor on insulator (ETSOI) layer") that is present on a buried dielectric layer of the ETSOI substrate has a thickness of 15 nm or less. In some embodiments, the SOI layer of the ETSOI substrate has a thickness of 10 nm or less. As used herein, the term "channel" is the region underlying the gate structure and between the source and drain of a semiconductor device that becomes conductive when the semiconductor device is turned on. A "fully depleted channel" is an undoped or very lightly doped region, which removes dopants, i.e., charge carriers, from the channel while the semiconductor device is in the "off" state. By "very lightly doped" it is meant that the maximum amount of dopant in the channel is no greater than $10^{17}$ atoms/cm$^3$. In some embodiments, the fully depleted channel extends the entire depth of the ETSOI layer in which the channel region is present. By entire depth it is meant that the fully depleted channel extends from the bottom surface of the gate dielectric of the functioning gate structure to the upper surface of the buried dielectric layer of the ETSOI substrate. In some embodiments, a fully depleted channel advantageously reduces random dopant fluctuation (RDF) in the semiconductor device, thereby facilitating threshold voltage (VDD) scaling and improved mobility for increased effective current.

In some embodiments, to provide a strained and fully depleted channel in the ETSOI layer of the ETSOI substrate, the portion of the ETSOI layer that provides the channel of the device is etched to reduce its thickness, and an epitaxially grown semiconductor material having a different lattice dimension than the ETSOI layer is formed on the etched portion of the ETSOI layer. It has been determined that fully depleted semiconductor on insulator (SOI) devices, i.e., semiconductor devices that have a fully depleted channel, require that the total channel thickness be kept below a certain value to enable short channel control. For example, and in some embodiments, for short channel control in planar semiconductor devices including a fully depleted channel in the ETSOI layer of an ETSOI substrate, the channel of the device should have a totally thickness of 5 nm or 6 nm or lower. In another example, in which the semiconductor device is a finFET including a fully depleted channel in the ETSOI layer of an ETSOI substrate, to enable short channel control, the width of the fin structure composed of the ETSOI layer may be 10 nm or less.

The methods and structures formed herein employ the use of a replacement gate structure to etch the channel portion of the ETSOI layer followed by epitaxially forming the semiconductor material having the different lattice structure to produce a strained channel. The use of a replacement gate structure may also be referred to as a gate last process flow. In some embodiments, by employing the gate last process flow, the strained channel may be formed after high temperature processing, ion implantation processing, and recess formation processes that are used in forming the semiconductor device. Therefore, the strained channel formed by the methods and structures disclosed herein is not impacted by the aforementioned device processing, which if subjected to the strained channel could cause strain relaxation.

FIGS. 1-4 depict one embodiment of a method of forming a planar semiconductor device formed on an ETSOI substrate 5. The term "planar" as used to describe a semiconductor device denotes that the direction of charge carriers from the source region to the drain region of the semiconductor device is along a plane that is parallel to the upper surface of the substrate, wherein the functional gate structure is present on the upper surface of the substrate. In one embodiment, the planar semiconductor device is a field effect transistor. As used herein a "field effect transistor" is a transistor in which output current, i.e., source-drain current, is controlled by the voltage applied to a functional gate structure. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain. A "functional gate structure" means a structure used to control output current (i.e., flow of carriers in the channel) of a semiconducting device through electrical or magnetic fields.

FIG. 1 illustrates the results of the processing steps that produce an ETSOI substrate 5, in which the ETSOI substrate 5 comprises at least an ETSOI layer 20 overlying a buried dielectric layer 15, wherein the ETSOI layer 20 has a thickness of less than 10 nm. A base semiconductor layer 10 may be present underlying the buried dielectric layer 15. The ETSOI layer 20 and the base semiconductor layer 10 may be composed of the same or a different semiconductor material.

The semiconductor material that provides the ETSOI layer 20 may be any semiconducting material including, but not limited to Si, SiC, SiGe, SiGeC, Si alloys, Ge, Ge alloys, GaAs, InAs, and InP, or any combination thereof. The semiconductor material of the ETSOI layer 20 typically has a lattice dimension that when employed with the subsequently formed epitaxially grown semiconductor layer (not shown) will produce a strain in the channel of the semiconductor device that is formed on the ETSOI substrate 5. In one embodiment, the semiconductor material that provides the ETSOI layer 20 is silicon (Si). The semiconductor material that provides the ETSOI layer 20 may be thinned to a desired thickness by planarization, grinding, wet etch, dry etch, oxidation followed by oxide etch, or any combination thereof. One method of thinning the semiconductor material for the ETSOI layer 20 is to oxidize the silicon by a thermal dry or wet oxidation process, and then wet etch the oxide layer using a hydrofluoric (HF) acid mixture. This process can be repeated to achieve the desired thickness. In one embodiment, the ETSOI layer 20 has a first thickness T1 ranging from 1.0 nm to 8.0 nm. In another embodiment, the ETSOI 20 has a first thickness T1 ranging from 2.0 nm to 6.0 nm. In one example, the ETSOI layer 20 has a first thickness T1 of 5.0 nm or 6.0 nm. The base semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

In some embodiments and to provide a fully depleted channel region, the semiconductor material that provides the ETSOI layer 20 may be an intrinsic semiconductor that is free of n-type or p-type dopant. The maximum concentration of p-type or n-type dopant that is present in the channel portion of the ETSOI layer 20 may be limited to $10^{17}$ atoms/cm$^3$. In another embodiment, the maximum concentration of p-type or n-type dopant that is present in the channel portion of the ETSOI layer 20 may be limited to $10^{17}$ atoms/cm$^3$. It is noted that the present disclosure is not limited to semiconductor devices having fully depleted channel regions. For example, the channel of the semiconductor device can be doped if desired. In one embodiment, the channel can have a dopant concentration of $10^{18}$ atoms/cm$^3$ to $10^{19}$ atoms/cm$^3$ to adjust the desired threshold voltage (Vt).

The buried dielectric layer 15 that may be present underlying the ETSOI layer 20 and atop the base semiconductor layer 10 may be formed by implanting a high-energy dopant into a bulk semiconductor substrate and then annealing the structure to form a buried dielectric layer 15. In another embodiment, the buried dielectric layer 15 may be deposited or grown prior to the formation of the ETSOI layer 20. In yet another embodiment, the ETSOI substrate 5 may be formed using wafer-bonding techniques, where a bonded wafer pair is formed utilizing glue, adhesive polymer, or direct bonding.

Still referring to FIG. 1, a replacement gate structure 30 is formed on the channel portion of the ETSOI layer 20. As used herein, the term "replacement gate structure 30" denotes a sacrificial structure that dictates the geometry and location of the later formed functioning gate structure. The sacrificial material that provides the replacement gate structure 30 may be composed of any material that can be etched selectively to the underlying ETSOI layer 20 of the ETSOI substrate 5. In one embodiment, the sacrificial material that provides the replacement gate structure 30 may be composed of a silicon-containing material, such as polysilicon. Although, the replacement gate structure 30 is typically composed of a semiconductor material, the replacement gate structure 30 may also be composed of a dielectric material, such as an oxide, nitride or oxynitride material, or amorphous carbon.

The sacrificial material may be patterned and etched to provide the replacement gate structure 30. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the replacement gate structure 30, while the exposed regions are removed using a selective etching process that removes the unprotected regions. Following formation of the replacement gate structure 30, the photoresist may be removed.

At least one dielectric gate spacer (not depicted) may then be formed adjacent to the replacement gate structure 30, i.e., in direct contact with the sidewall of the replacement gate structure 30. In one embodiment, the at last one dielectric gate spacer may be formed by using a blanket layer deposition, such as chemical vapor deposition, and an anisotropic etch-back method. The at least one dielectric gate spacer may have a width ranging from 2.0 nm to 15.0 nm, and may be composed of a dielectric, such as a nitride, oxide, oxynitride, or a combination thereof. The dielectric gate spacer is optional, and may be omitted.

In some embodiments, extension source regions and the drain region (not shown) may then be formed in the portions of the ETSOI layer 20 that are present on opposing sides of replacement gate structure 30. In one embodiment, the extension source region and the extension drain region are formed using in situ doping, an ion implantation process, plasma doping, gas phase diffusion, diffusion from a doped oxide or a combination thereof. The conductivity type of the extension source region and the extension drain region typically dictates the conductivity type of the semiconductor device. As used herein, "p-type" refers to the addition of impurities to an intrinsic semiconductor that creates deficiencies of valence electrons. In a silicon-containing ETSOI layer 20, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing ETSOI layer 5 examples of n-type dopants, i.e., impurities, include but are not limited to antimony, arsenic and phosphorous.

FIG. 1 further depicts forming raised source and drain regions 25. The term "raised" as used to describe the raised source and drain regions 25 means that the lower surface of the raised source and drain regions 25 is in direct physical contact with the surface of the ETSOI substrate 5 on which the gate dielectric of the functional gates structure is present. The raised source and drain regions 25 may be formed using a selective epitaxial growth process. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. The fact that the process is selective means that the deposited semiconductor material grows only on exposed semiconductor regions and does not grow on a dielectric, such as silicon oxide. The epitaxial growth process may be continued until the raised source and drain regions 25 have a height ranging from 5 nm to 50 nm, as measured from the upper surface of the ETSOI substrate 5. Typically, the raised source and drain regions 25 are composed of a silicon containing material, such as silicon, silicon germanium, or silicon doped with carbon (Si:C).

Similar to the extension source and drain regions, the conductivity type of the raised source and drain regions 25 typically dictates the conductivity type of the semiconductor device. In some embodiments, the dopant that dictates the conductivity type of the raised source and drain regions 25 is introduced in-situ. By "in-situ" it is meant that the dopant that dictates the conductivity type of the raised source and drain regions 25 is introduced during the process step, e.g., epitaxial deposition, that forms the raised source and drain regions 25. Alternatively, the dopant that provides the conductivity type of the raised source and drain regions 25 is introduced by ion implantation. The p-type and n-type dopants for silicon containing raised source and drain regions 25 are similar to the p-type and n-type dopants for the extension source and drain regions. In some embodiments, in which the extension source and drain regions are not formed in the ETSOI layer 20 prior to forming the raised source and drain regions 25, the extension source and drain regions may be formed after the raised source and drain regions 25 by thermally diffusing the n-type or p-type dopant from the raised source and drain regions 25 into the underlying portion of the ETSOI layer 20. In some embodiments, the source and drain regions are activated by a high temperature anneal, while the replacement gate structure 30 is present in the structure.

FIG. 1 further depicts forming an interlevel dielectric layer 35 overlying the raised source and drain regions 25, and planarizing the interlevel dielectric layer 35 to be coplanar with an upper surface of the replacement gate structure 30. The interlevel dielectric 35 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 35 include any of the aforementioned materials in porous form, or in a form that changes during processing to or from being porous and/or permeable to being non-porous and/or non-permeable. The interlevel dielectric layer 35 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the dielectric material for the interlevel dielectric layer 35, a planarization processes is conducted to provide an upper surface, wherein the upper surface of the interlevel dielectric layer 35 is coplanar with the upper surface of the replacement gate structure 30. The planarization of the interlevel dielectric layer 23 may be provided by chemical mechanical planarization.

Figure 2:
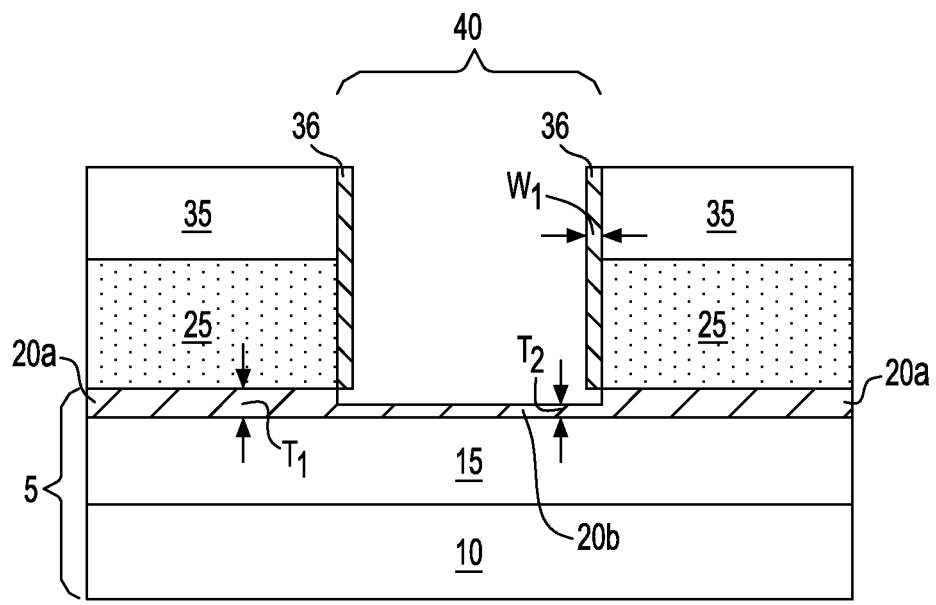
FIG. 2 is a side cross-sectional view depicting removing the replacement gate structure, and etching the channel portion of the ETSOI layer, in accordance with one embodiment of the present disclosure.

FIG. 2 depicts one embodiment of removing the replacement gate structure 30, and etching the channel portion of the ESTOI layer 20b. Following etching of the ETSOI layer 20b, the channel portion of the ESTOI layer 20b has a reduced thickness, i.e., second thickness T2, and the portion of the ETSOI layer 20a corresponding to the source and drain regions of the device has the original thickness, i.e., first thickness Ti. The second thickness T2 of the ETSOI layer 20b in the channel portion 40 of the device is less than the first thickness T1 of the ETSOI layer 20a that corresponds to the source and drain regions.

The etch process for removing the replacement gate structure 30 may be a selective etch. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The replacement gate structure 30 may be removed using a wet or dry etch process. In one embodiment, the replacement gate structure 30 is removed by reactive ion etch (RIE). In one example, an etch step for removing the replacement gate structure 30 can include an etch chemistry for removing the replacement gate structure 30 selective to the ETSOI layer 20b of the ETSOI substrate 5. When composed of polysilicon, the replacement gate structure 30 may be removed using etch chemistries, such as HBr, $SF_6$, and $NH_4OH$.

In some embodiments in which dielectric gate spacers have not been formed on the sidewalls of the replacement gate structure 30, following removal of the replacement gate structure 30, and prior to etching the channel portion of the ESTOI layer 20b, dielectric spacers 36 are formed on the sidewalls of the opening that are provided by the exposed surfaces of the raised source and drain regions 25. In one embodiment, the dielectric spacers 36 may be formed by using a blanket layer deposition, such as chemical vapor deposition, and an anisotropic etchback method. The dielectric spacers 36 may have a width W1 ranging from 2.0 nm to 15.0 nm, and may be composed of a dielectric, such as a nitride, oxide, oxynitride, or a combination thereof. The dielectric spacers 36 are optional, and may be omitted.

FIG. 2 depicts etching the channel portion of the ESTOI layer 20b that is exposed by removing the replacement gate structure 30. In one embodiment, the channel portion of the ESTOI layer 20b is etched with a halide based gas. A "halide based gas" is a chemical compound of a halogen with a more electropositive element or group in a gaseous phase. Halogens or halogen elements are a series of nonmetal elements from Group 17 IUPAC Style (formerly: VII, VIIA) of the periodic table of elements and comprise fluorine (F), chlorine ($Cl_2$), bromine (Br), and iodine (I). Examples of halide based gasses that are suitable as an etchant for etching the channel portion of the ESTOI layer 20b include chlorine gas ($Cl_2$), hydrogen fluoride (HF), hydrogen chloride (HCl), hydrogen bromide (HBr) and combinations thereof.

In one embodiment, the halide based gas that etches the channel portion of the ESTOI layer 20b further includes a carrier gas. For example, the carrier gas may be hydrogen ($H_2$), helium (He), argon (Ar) or nitrogen ($N_2$) gas. The carrier gas may comprise greater than 85% by volume of the halide based gas flow. In another embodiment, the carrier gas may comprise greater than 90% by volume of the halide based gas flow. In one embodiment, the gas flow is comprised of 90% by volume or greater of a carrier gas, such as hydrogen, 1% to 10% by volume of a halide based gas, such as hydrochloric acid (HCl).

In one embodiment, the halide based gas is applied to the channel portion of the ESTOI layer 20b at a flow rate ranging from 10 sccm to 20 slm. In another embodiment, the halide based gas is applied to the channel portion of the ESTOI layer 20b at a flow rate ranging from 100 sccm to 300 sccm. The time period for applying the halide based gas is typically greater than 2 seconds. In one embodiment, the time period for applying the halide based gas may range from 2 seconds to 600 seconds. In another embodiment, the time period for applying the halide based gas ranges from 30 seconds to 200 seconds. It is noted that the above flow rates are provided for illustrative purposes only and are not intended to limit the present disclosure.

Following etching of the channel portion of the ESTOI layer 20b, the second thickness T2 of the remaining portion of the ETSOI layer 20b may range from 1 nm to 4 nm. In another embodiment, the second thickness T2 of the channel portion of the ESTOI layer 20b ranges from 1 nm to 3 nm. In one example, the second thickness of the ETSOI layer 20b is equal to 2 nm. The first thickness T1 of the portion of the ETSOI layer 20a that corresponds to the source and drain regions ranges from 1.0 nm to 8.0 nm. In another embodiment, the portion of the ETSOI layer 20a corresponding to the source and drain region of the device has a first thickness T1 that ranges from 2.0 nm to 6.0 nm.

Figure 3:
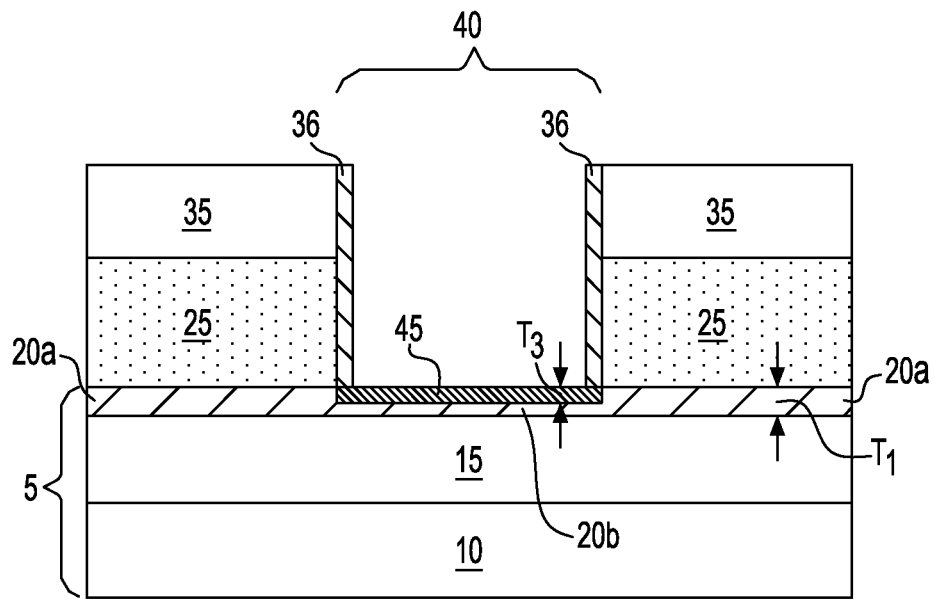
FIG. 3 is a side cross-sectional view depicting depositing an epitaxially grown semiconductor layer on the channel portion of the ETSOI layer, wherein the lattice dimension of the epitaxially grown semiconductor layer is different than the lattice dimension of the channel portion of the ETSOI layer to provide a strained channel, in accordance with one embodiment of the present disclosure.

FIG. 3 depicts depositing an epitaxially grown semiconductor layer 45 on the channel portion of the ESTOI layer 20b, wherein the lattice dimension of the epitaxially grown semiconductor layer 45 is different than the lattice dimension of the channel portion 40 of the ETSOI layer 20a to provide a strained channel. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, the depositing atoms have no surface to align to, resulting in the formation of polycrystalline or amorphous silicon instead of single crystal silicon. The temperature for epitaxial silicon deposition typically ranges from 550° C. to 900° C. Although higher temperature typically results in faster deposition, the faster deposition may result in crystal defects and film cracking.

In one embodiment, the epitaxially grown semiconductor layer 45 may be composed of silicon-containing material. A number of different sources may be used for the deposition of epitaxial silicon. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The temperature for epitaxial silicon deposition typically ranges from 250° C. to 900° C.

In another embodiment, the epitaxially grown semiconductor layer 45 may be composed of germanium (Ge). A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

In yet another embodiment, the epitaxially grown semiconductor layer 45 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 90%, by atomic weight %. In another embodiment, the germanium content of the epitaxial layer of silicon germanium may range from 10% to 40%.

In an even further embodiment, the epitaxially grown semiconductor layer 45 is composed of silicon doped with carbon (Si:C). The carbon (C) content of the epitaxial grown silicon doped with carbon may range from 0.3% to 5%, by atomic weight %. In another embodiment, the carbon content of the epitaxial grown silicon doped with carbon may range from 1% to 2.7%.

In one embodiment, the epitaxially grown semiconductor layer 45 has a thickness T3 ranging from 1 nm to 4 nm. In another embodiment, the thickness T3 of the epitaxially grown semiconductor layer 45 ranges from 1 nm to 3 nm. In one example, the thickness T3 of the epitaxially grown semiconductor layer 45 is equal to 2 nm. In some embodiments, the thickness of the epitaxially grown semiconductor layer 45 is selected so that the upper surface of the epitaxially grown semiconductor layer 45 is coplanar with the upper surface of the portion of the ETSOI layer 20a corresponding to the source and drain regions of the semiconductor device, i.e., the portions of the ETSOI layer 20a having the first thickness T1.

In some embodiments, when the semiconductor device being formed is a p-type conductivity semiconductor device, such as a p-type field effect transistor (pFET), the material of the epitaxially grown semiconductor layer 45 is selected so that the mismatch between the lattice dimension of the channel portion of the ESTOI layer 20b and the epitaxially grown semiconductor layer 45 provides a compressively strained channel. In some embodiments and to provide a compressively strained channel region, the material of the epitaxially grown semiconductor layer 45 is selected to have a greater lattice dimension than the lattice dimension of the channel portion of the ESTOI layer 20b. For example, when the channel portion of the ESTOI layer 20b is composed of silicon (Si), an epitaxially grown semiconductor layer 45 composed of silicon germanium (SiGe) or germanium (Ge) provides a compressively strained channel region. In one example, the compressive strain on the channel of the semiconductor device produced by the combination of a silicon (Si) ETSOI layer 20b and a silicon germanium (SiGe) or germanium (Ge) epitaxially grown semiconductor layer 45 may have a magnitude ranging from 100 MPa to 1000 MPa. In another example, the compressive strain on the channel of the semiconductor device has a magnitude ranging from 300 MPa to 400 MPa. Compressive strain increases the speed of hole charge carriers, and therefore provides performance enhancements, such as increased switching speed, in p-type semiconductor devices.

In some embodiments and when the semiconductor device being formed is an n-type conductivity semiconductor device, such as an n-type field effect transistor (nFET), the material of the epitaxially grown semiconductor layer 45 is selected so that the mismatch between the lattice dimension of the channel portion of the ESTOI layer 20b and the epitaxially grown semiconductor layer 45 provides a tensile strained channel. In some embodiments and to provide a tensile strained channel, the material of the epitaxially grown semiconductor layer 45 is selected to have a smaller lattice dimension than the lattice dimension of the channel portion of the ESTOI layer 20b. For example, when the channel portion of the ESTOI layer 20b is composed of silicon (Si), an epitaxially grown semiconductor layer 45 composed of silicon doped with carbon (Si:C) provides a tensile strained channel. In one example, the tensile strain on the channel of the semiconductor device produced by the combination of a silicon (Si) ETSOI layer 20b and a silicon doped with carbon (Si:C) epitaxially grown semiconductor layer 45 may have a magnitude ranging from 100 MPa to 1500 MPa. In another example, tensile strain on the channel may have a magnitude ranging from 300 MPa to about 400 MPa. Tensile strain increases the speed of electron charge carriers, and therefore provides performance enhancements, such as increased switching speed, in n-type semiconductor devices.

Figure 4:
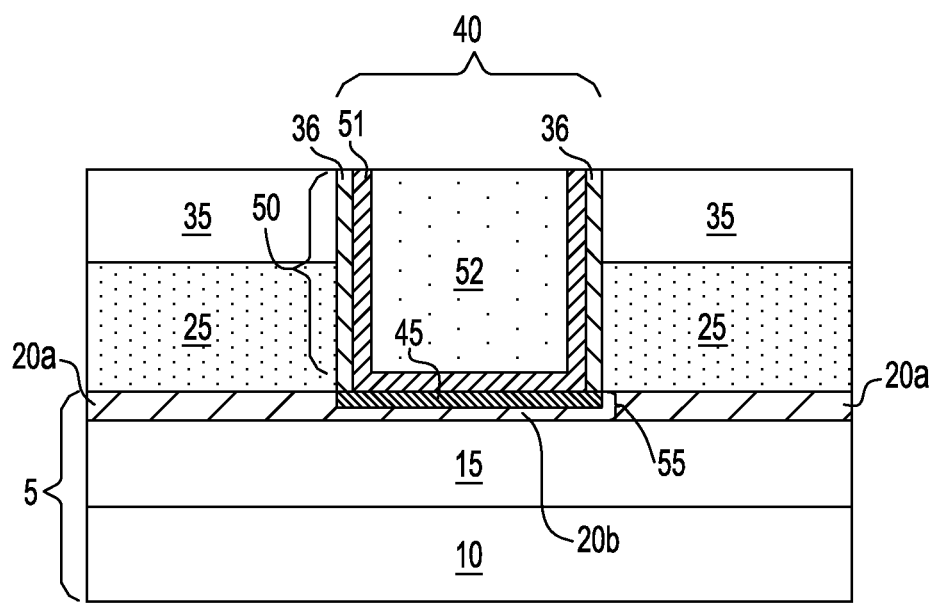
FIG. 4 is a side cross-sectional view depicting one embodiment of forming a functional gate structure on the strained channel, in accordance with the present disclosure.

FIG. 4 depicts forming a functional gate structure 50 on the strained channel that is provided by the combination of the channel portion of the ESTOI layer 20b and the epitaxially grown semiconductor layer 45. The combination of the channel portion of the ESTOI layer 20b and the epitaxially grown semiconductor layer 45 is hereafter referred to as a fully depleted multi-layered strained channel portion 55 of the ETSOI layer 20a, 20b. The channel is fully depleted, because there are substantially no charge carriers within the channel portion of the device when the device is in the "off" state. The functioning gate structure 50 that is present on the fully depleted multi-layered strained channel portion 55 of the ETSOI layer 20a, 20b may include at least one gate dielectric 51 and at least one gate conductor 52.

The at least one gate dielectric 51 may be composed of any dielectric material including oxides, nitrides and oxynitrides. In one embodiment, the at least one gate dielectric 51 may be provided by a high-k dielectric material. The term "high-k" as used to describe the material of the at least one gate dielectric 51 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In an even further example, the dielectric constant of the high-k dielectric material may be greater than 10.0. In one embodiment, the at least one gate dielectric 51 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 51 include hafnium silicate, hafnium silicon oxynitride or combinations thereof.

In one embodiment, the at least one gate dielectric 51 may be deposited by chemical vapor deposition (CVD). Variations of CVD processes suitable for depositing the gate dielectric 51 include, but are not limited to: Atmospheric Pressure CVD (APCVD), Low Pressure CVD (LPCVD), Plasma Enhanced CVD (EPCVD), Metal-Organic CVD (MOCVD) and combinations thereof. In one embodiment, the at least one gate dielectric 51 may be deposited using a conformal deposition method. The term "conformal" denotes a layer having a thickness that does not deviate from greater than or less than 20% of an average value for the thickness of the layer. In one embodiment, the at least one gate dielectric 51 is deposited on the fully depleted multi-layered strained channel portion 55 of the ETSOI layer 20a, 20b as well as the surfaces of the raised source and drain regions 25 that are exposed by removing the replacement gate structure. In one embodiment, the thickness of the at least one gate dielectric 51 is greater than 0.8 nm. More typically, the at least one gate dielectric 51 has a thickness ranging from about 1.0 nm to about 6.0 nm.

In a following process step, the at least one gate conductor 52 is formed on the at least one gate dielectric 51. The at least one gate conductor 52 may be formed by a deposition process, such as CVD, plasma-assisted CVD, plating, and/or sputtering, followed by planarization. In one embodiment, the at least one gate conductor 52 is composed of metal or a doped semiconductor. Examples of metals that may be employed for the at least one gate conductor 52 may include, but is not limited to, W, Ni, Ti, Mo, Ta, Cu, Pt, Ag, Au, Ru, Tr, Rh, and Re, and alloys thereof. One example of a doped semiconductor that is suitable for the at least one gate conductor 52 is doped polysilicon.

Figure 5:
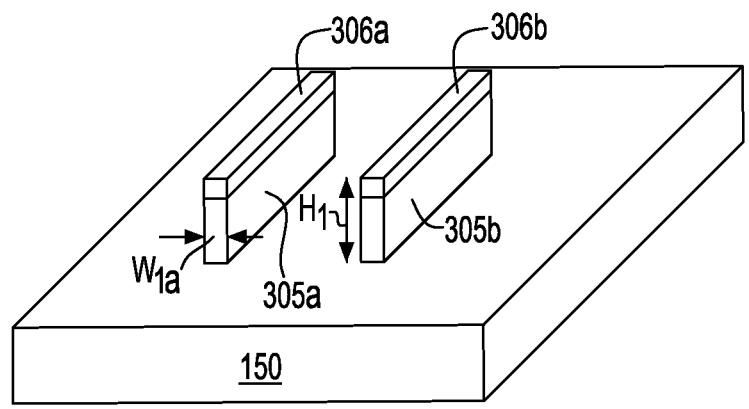
FIG. 5 is a perspective view depicting one embodiment of forming fin structures having a width of less than 20 nm, as used in one embodiment of a method for forming a finFETs device, in accordance with the present disclosure.

FIGS. 5-11B depict one embodiment of a method of fabricating a finFET semiconductor device that includes a fully depleted multi-layer strained channel. In one embodiment, the method may include providing at least one fin structure 305a, 305b having a first width $W1_a$ of less than 20 nm, wherein the at least one fin structure 305a, 305b is composed of a first semiconductor material. As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In one embodiment, the fin structures 305a, 305b, and the dielectric layer 150 that the fin structures 305a, 305b are present on, may be provided from an SOI substrate, in which the SOI layer of the ETSOI substrate provides the fin structures 305a, 305b. One example of an SOI substrate suitable for forming the fin structures 305a, 305b that are depicted in FIG. 5 has been described above with reference to FIG. 1. In some embodiments, to provide a fully depleted channel region, the semiconductor material that provides the SOI layer that provides the fin structures 305a, 305b may be an intrinsic semiconductor that is free of n-type or p-type dopant. The maximum concentration of p-type or n-type dopant that is present in the portion of the SOI layer that provides the channel of the finFETs may be limited to $10^{17}$ atoms/cm$^3$ or less. It is noted that the present disclosure is not limited to fin structures 305a, 305b that provide a fully depleted channel. For example, the channel of the finFET device can be doped if desired. In one embodiment, the channel of the finFETs can have a dopant concentration of $10^{18}$ atoms/cm$^3$ to $10^{19}$ atoms/cm$^3$ to adjust the desired threshold voltage (Vt).

In one embodiment and prior to etching the SOI substrate to provide the fin structure 305a, 305b, a layer of the dielectric material can be deposited atop the SOI substrate to provide a dielectric fin cap 306a, 306b that is present on the upper surface of each fin structures 305a, 305b. The material layer that provides the dielectric fin caps 306a, 306b may be composed of a nitride, oxide, oxynitride material, and/or any other suitable dielectric layer. The material layer that provides the dielectric fin cap 306a, 306b can be formed by a deposition process, such as chemical vapor deposition (CVD) and/or atomic layer deposition (ALD). Alternatively, the material layer that provides the dielectric fin cap 306a, 306b may be formed using a growth process, such as thermal oxidation or thermal nitridation. The material layer that provides the dielectric fin cap 306a, 306b may have a thickness ranging from 1 nm to 100 nm.

In one embodiment and following the formation of the layer of dielectric material that provides the dielectric fin cap 306a, 306b, a photolithography and etch process sequence is applied to the material layer for the dielectric fin caps 306a, 306b and the SOI substrate to form each fin structures 305a, 305b. Specifically and in one example, a photoresist mask (not shown) is formed overlying the layer of the dielectric material that provides dielectric fin cap 306a, 306b and is present overlying the SOI layer of the SOI substrate, in which the portion of the dielectric material that is underlying the photoresist mask provides the dielectric fin caps 306a, 306b, and the portion of the SOI layer that is underlying the photoresist mask provides the fin structure 305a, 305b. The exposed portions of the dielectric material that provides dielectric fin cap 305a, 305b and the SOI layer, which are not protected by the photoresist mask, are removed using a selective etch process. In one embodiment, each of the fin structures 305a, 305b may have a height $H_1$ ranging from 5 nm to 200 nm. In another embodiment, each of the fin structures 305a, 305b has a height $H_1$ ranging from 10 nm to 100 nm. The fin structures 305a, 305b may each have a width $W_{1a}$ (also referred to as first width $W_{1a}$) of less than 20 nm. In one embodiment, the first width $W_{1a}$ of the fin structures 305a, 305b ranges from 2 nm to 20 nm. In one embodiment, each of the fin structures 305a, 305b has a first width $W_{1a}$ ranging from 3 nm to 8 nm. In another embodiment, the first width $W_{1a}$ of the fin structures 305a, 305b ranges from 2 nm to 4 nm. It is noted that any number of fin structures 305a, 305b may be formed.

Figure 6:
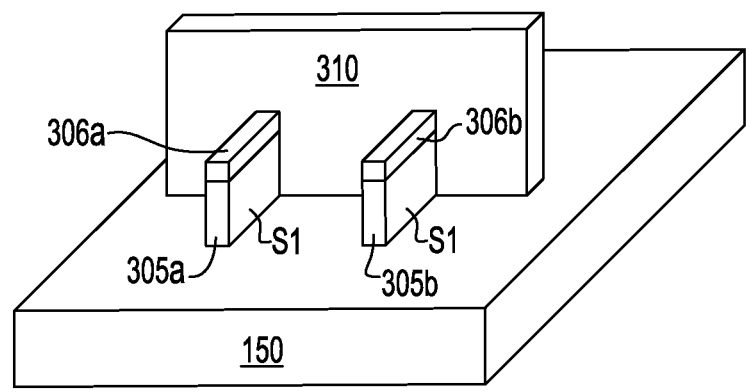
FIG. 6 is a perspective view depicting forming replacement gate structures on the fin structures, in accordance with the present disclosure.

FIG. 6 depicts forming a replacement gate structure 310 on the fin structures 305a, 305b and the dielectric fin caps 306a, 306b. Materials suitable for forming the replacement gate structure 310 depicted in FIG. 6 have been described above for the replacement gate structure 30 that is depicted in FIG. 1. Similar to the replacement gate structure 30 depicted in FIG. 1, the replacement gate structure 310 that is depicted in FIG. 6 can be formed utilizing deposition, photolithography and etch process steps. For example, a material layer for the replacement gate structure 310 may be deposited over the fin structures 305a, 305b. Thereafter, a pattern corresponding to the geometry of the replacement gate structures 310 is formed overlying the deposited material layer by applying a photoresist to the surface to be etched, exposing the photoresist to a pattern of radiation, and then developing the pattern into the photoresist utilizing a resist developer. Once the patterning of the photoresist is completed, the sections covered by the patterned photoresist are protected while the exposed regions are removed using a selective etching process that removes the unprotected regions. In one embodiment, the portion of the material layer for replacement gate structure 310 that is removed exposes the sidewalls 51 of the fin structures 305a, 305b.

Figure 7:
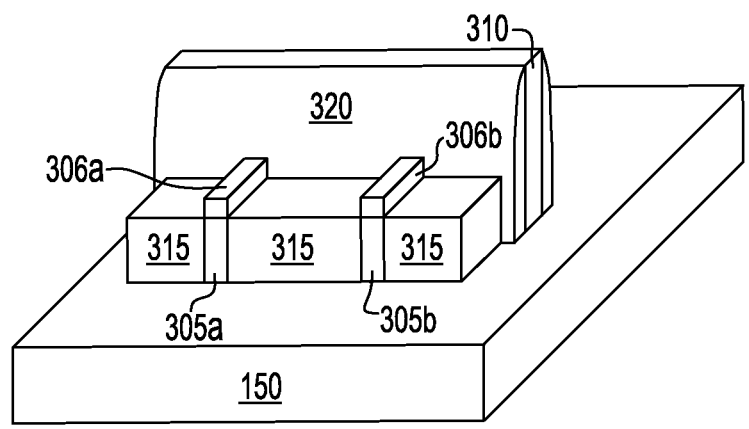
FIG. 7 is a perspective view depicting one embodiment of forming source and drain regions on the exposed sidewalls of the fin structures on each side of the replacement gate structure, in accordance with one embodiment of the present disclosure.

FIG. 7 depicts one embodiment of forming source and drain regions on the exposed sidewalls S1 of the fin structures 305a, 305b on each side of the replacement gate structure 310. In some embodiment, prior to forming the source and drain region, spacers 320 may be formed in direct contact with the replacement gate structure 310. The spacer 320 may be composed of a dielectric material, such as an oxide, nitride or oxynitride material. The spacers 320 may be formed using deposition and etch processes similar for forming the dielectric gate spacers described above with reference to FIGS. 1 and 2. The spacers 320 may have a width ranging from 1 nm to 10 nm, typically ranging from 1 nm to 5 nm.

The source and drain regions may be provided by in-situ doped epitaxially grown semiconductor material 315 that is formed on the sidewalls Si of the fin structures 305a, 305b. The composition and method of depositing the in-situ doped epitaxially grown semiconductor material 315 that is depicted in FIG. 7 is similar to the in-situ doped epitaxially grown semiconductor material that provides the raised source and drain regions 25 of the planar device depicted in FIG. 2. N-type finFET devices may be produced by doping the in-situ doped semiconductor material with elements from group V of the Periodic Table of Elements. P-type finFET devices are produced by doping the in-situ doped semiconductor material with elements from group III of the Periodic Table of Elements. In one embodiment, dopant from the in-situ doped epitaxially grown semiconductor material is diffused into the fin structures 305a, 305b to form extension regions for the source and drain regions. The portion of the fin structures 305a, 305b that is present between the extension regions is the channel region of the finFET device. In some embodiments, the source and drain regions are activated by a high temperature anneal, while the replacement gate structure 310 is present in the structure.

Figure 8:
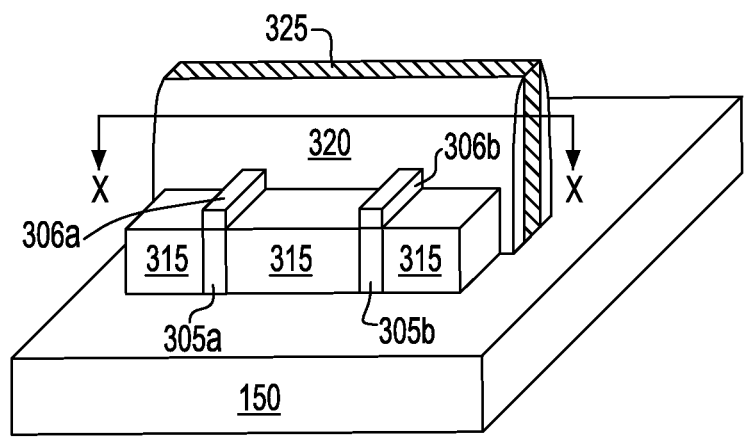
FIG. 8 is a perspective view depicting one embodiment of removing the replacement gate structure, in accordance with the present disclosure.

FIG. 8 depicts one embodiment of removing the replacement gate structure 310 to expose the channel portion 325 of the fin structures 305a, 305b. In one embodiment, prior to removing the replacement gate structure 310, an interlevel dielectric layer (not show) is formed having an upper surface that is coplanar with the replacement gate structure 310. The interlevel dielectric layer that is formed on the fin structures 305a, 305b is similar to the interlevel dielectric layer 35 that has been described above with reference to FIG. 1. Therefore, the compositions and methods of forming the interlevel dielectric layer 35 depicted in FIG. 1 are suitable for the interlevel dielectric layer that is formed on the fin structures 305a, 305b.

The replacement gate structure 310 is removed following the formation of the interlevel dielectric layer. Removing the replacement gate structure 310 provides an opening to expose the channel portion 325 of the fin structures 305a, 305b. In FIG. 8, dielectric fin caps 306a, 306b are present on the upper surface of the fin structures 305a, 305b, but the sidewall of the fin structures 305a, 305b is exposed by removing the replacement gate structure. The process for removing the replacement gate structure 310 that is depicted in FIG. 8 is similar to the process for removing the replacement gate structure 30 that is described above with reference to FIG. 3.

Figure 9A:
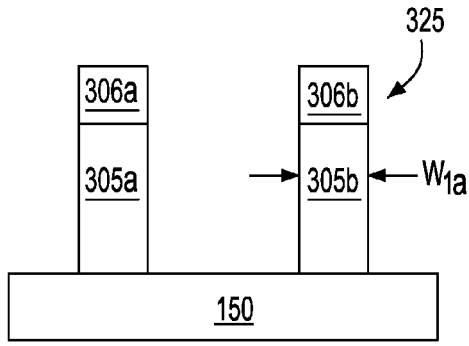
FIGS. 9A and 9B are side cross-sectional views along section line X-X in FIG. 8 depicting etching the channel portion of the fin structures, in accordance with one embodiment of the present disclosure.
Figure 9B:
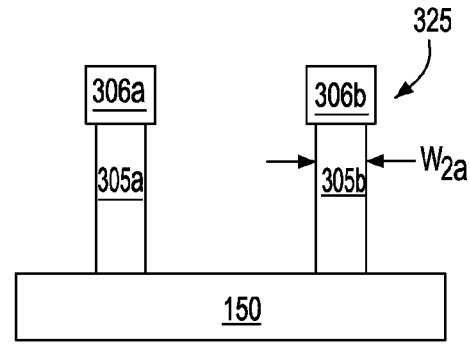

FIGS. 9A and 9B are cross-sectional views of the fin structures 305a, 305b including the dielectric fin caps 306a, 306b along section line X-X of FIG. 8. FIGS. 9A and 9B depict one embodiment of etching the channel portion 325 of the fin structures 305a, 305b, wherein the etch process reduces the width of the channel portion. More specifically, FIGS. 9A and 9B depict reducing the width of the fin structures 305a, 305b from their original width $W1_a$ (hereafter referred to as first width $W1_a$), as depicted in FIG. 9A, to a lesser second width $W2_a$, as depicted in FIG. 9B. As indicated above, the first width $W_{1a}$ is typically less than 20 nm. In one embodiment, the first width $W_{1a}$ of the fin structures 305a, 305b ranges from 2 nm to 20 nm. In one embodiment, each of the fin structures 305a, 305b has a width $W_{1a}$ ranging from 3 nm to 8 nm. In another embodiment, the first width $W_{1a}$ of the fin structures 305a, 305b ranges from 2 nm to 4 nm. Following etching, the second width $W2_a$ for each of the fin structures 305a, 305b may range from 2 nm to 10 nm. In another embodiment, the second width $W2_a$ for each of the fin structures 305a, 305b following etching may range from 3 nm to 6 nm. In yet another example, the width of each of the fin structures 305a, 305b may be reduced to a second width $W_{2a}$ ranging from 4 nm to 5 nm. In yet another example, the width of each of the fin structures 305a, 305b may be reduced to a second width $W_{2a}$ ranging from 2 nm to 3 nm.

The etch process that reduces the width of the fin structures 305a, 305b may be an isotropic etch process. Contrary, to an anisotropic etch process, an isotropic etch process is non-directional. The etch process applied to the fin structures 305a, 305b that is depicted in FIGS. 9A and 9B is similar to the etch process that is described above for reducing the thickness of the channel portion of the SOI layer 20b that is described above with reference to FIG. 2. Therefore, the description of the etch process that reduces the thickness of the channel portion of the SOI layer 20b that is depicted in FIG. 2 is suitable for describing the etch process that reduces the width of the fin structures 305a, 305b that are depicted in FIGS. 9A and 9B. Typically, the etch chemistry for reducing the width of the fin structures 305a, 305b is selective to the dielectric fin caps 306a, 306b. Similar to the etch process for reducing the thickness of the channel portion of the SOI layer 20b that is depicted in FIG. 2, the etch process that reduces the width of the fin structures 305a, 305b may include a halide based gas, which may include chlorine gas ($Cl_2$), hydrogen fluoride (HF), hydrogen chloride (HCl), hydrogen bromide (HBr) and combinations thereof. Further details on the etch process for reducing the width of the fin structures 305a, 305b with etch processes employing halide based gasses are described above with reference to FIG. 2.

Figure 10:
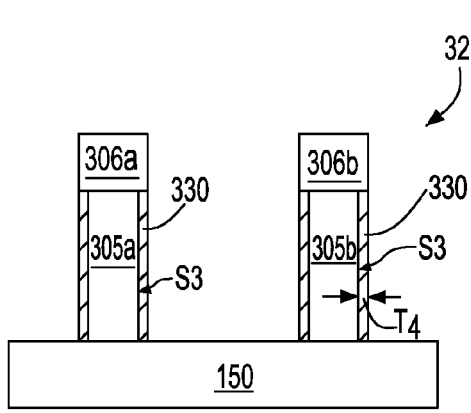
FIG. 10 is a side cross-sectional view depicting depositing an epitaxially grown semiconductor layer on the etched channel portion of at least one fin structure depicted in FIG. 9B, in accordance with one embodiment of the present disclosure.

FIG. 10 depicts one embodiment of depositing an epitaxially grown semiconductor layer 330 on the channel portion 325 of the fin structure 305a, 305b having the second width $W_{2a}$, in which a lattice dimension of the epitaxially grown semiconductor layer 330 is different than a lattice dimension of the channel portion 325 of the at least one fin structure 305a, 305b to provide a strained channel. The epitaxially grown semiconductor layer 330 is formed on the exposed sidewalls S3 of the fin structures 305a, 305b, but is not formed on the upper surface of the fin structures 305a, 305b that are covered with the dielectric fin caps 306a, 306b. In one embodiment, the epitaxially formed second semiconductor layer 330 has a thickness T4 ranging from 1 nm to 10 nm. In another embodiment, the epitaxially formed second semiconductor layer 330 has a thickness T4 that ranges from 2 nm to 5 nm.

The epitaxially grown semiconductor layer 330 that is depicted in FIG. 10 is similar to the epitaxially grown semiconductor layer 45 that is formed on the channel portion of the ESTOI layer 20b that is described above with reference to FIG. 3. Therefore, the description of the composition and the method of forming the epitaxially grown semiconductor layer 45 that is depicted in FIG. 3 is suitable for the epitaxially grown semiconductor layer 330 that is depicted in FIG. 10. The strain produced by the difference in lattice structure has also been described above with reference to FIG. 3. In one example, epitaxially grown semiconductor layers 330 composed of silicon germanium (SiGe) are deposited on channel portions 325 of fin structures 305a, 305b composed of silicon (Si) to provide a compressively strained channels that are suitable for increasing carrier speed in p-type finFETs (pfinFETs). In another example, epitaxially grown semiconductor layers 330 composed of silicon doped with carbon (Si:C) are deposited on channel portions 325 of fin structures 305a, 305b composed of silicon (Si) to provide a tensile strained channel that is suitable for increasing carrier speed in n-type finFETs (nfinFETs).

The strained channel that is produced by the etched channel portion 325 of the fin structures 305a, 305b and the epitaxially grown semiconductor layer 330 are hereafter collectively referred to as a fully depleted multi-layer strained channel. The channel is fully depleted, because there are substantially no charge carriers within the channel portion of the device when the device is in the "off" state. In the embodiments, in which the finFET is a p-type conductivity finFET, the compressive strain on the fully depleted multi-layer strained channel may range from 100 MPa to 1500 MPa, and in some examples may range from 300 MPa to 400 MPa. In the embodiments, in which the finFET is an n-type conductivity finFET, the tensile strain on the fully depleted multi-layer strained channel may range from 100 MPa to 1000 MPa, and in some examples may range from 300 MPa to 400 MPa. It is noted that the above strain levels are provided for illustrative purposes only, and it is not intended for the present disclosure to be limited to only these ranges. The strain in the channel can be quite high depending upon the lattice mismatch. For example, with 20% silicon germanium (SiGe) on silicon (Si), the strain will be about 1.3 GPa.

Figure 11A:
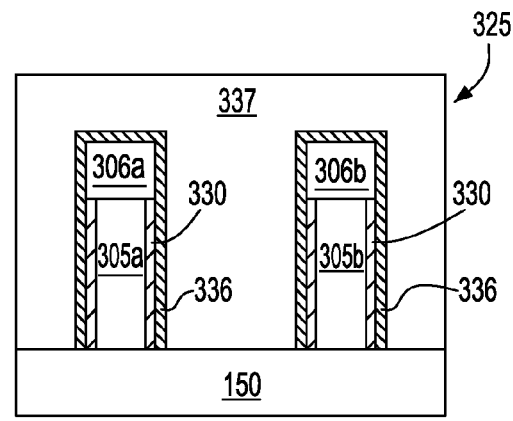
FIG. 11A is a side cross-sectional view depicting forming a function gate structure on the epitaxially grown semiconductor layer of the channel portion of the fin structure, in accordance with one embodiment of the present disclosure.
Figure 11B:
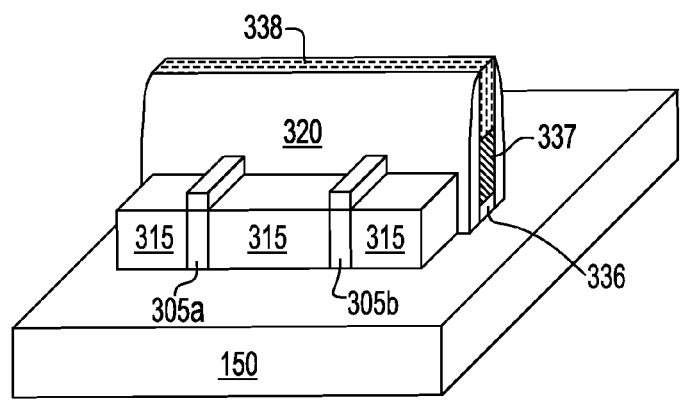
FIG. 11B is a perspective view of the structure depicted in FIG. 11A.

FIGS. 11A and 11B depict forming a functional gate structure 335 on the fully depleted multi-layer strained channel of the fin structures 305a, 305b. In one embodiment, the functional gate structure 335 is formed in direct contact with the sidewall surfaces of the fully depleted multi-layer strained channel of the fin structures 305a, 305b. In one embodiment, each functional gate structure 335 includes at least one gate dielectric 336 that is present on, e.g., in direct contact with, the fin structures 305a, 305b, and at least one gate conductor 337 that is present on the at least one gate dielectric 336. Referring to FIG. 11B, the functional gate structure 335 may also include a gate dielectric cap 338 that is present on an upper surface of the at least one gate conductor 337. The at least one gate dielectric 336 is typically positioned on at least a portion of the sidewalls of the fin structures 305a, 305b, but may also be formed in direct contact with the dielectric fin caps 306a, 306b on the upper surface of the fin structures 305a, 305b. The functional gate structure 335 may be formed by forming blanket material layers for the at least one gate dielectric 336, the at least one gate conductor 337, and gate dielectric cap 338 to provide a gate stack, and patterning and etching the gate stack to provide the functional gate structures 335. The functional gate structure 335 that is depicted in FIGS. 11A and 11B is similar to the functional gate structure 50 that is described with reference to FIG. 4. Therefore, further details regarding the compositions for the at least one gate dielectric 336, and the at least one gate conductor 337 for the functional gate structure 335 depicted in FIGS. 11A and 11B have been described above for the at least one gate dielectric 51 and the at least one gate conductor 52 that have been described above with reference to FIG. 4.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A fin field effect transistor (finFET) comprising:
a fin structure located on a substrate, the fin structure comprising a channel portion and source and drain extension regions separated from one another by the channel portion, wherein the channel portion and the source and drain extension regions are composed of a single first semiconductor material, and the source and drain extension regions have a first width and the channel portion has a second width smaller than the first width such that sidewalls of the channel portion are offset from sidewalls of the source and drain extension regions;
an epitaxially grown semiconductor layer of a second semiconductor material that is different from the first semiconductor material present on the sidewalls of the channel portion, wherein the epitaxially grown semiconductor layer has a thickness that is the first width less the second width, and the second semiconductor material has a different lattice dimension than the first semiconductor material; and
a functional gate structure straddling the channel portion of the fin structure and in contact with the epitaxially grown semiconductor layer.

2. The finFET of claim 1, wherein epitaxially grown semiconductor layer and the channel portion constitute a multi-layer strained channel portion of the finFET that is fully depleted.

3. The finFET of claim 2, wherein the source and drain extension regions of the fin structure are doped to a p-type conductivity, the first semiconductor material is silicon, and the second semiconductor material is silicon germanium (SiGe).

4. The finFET of claim 3, wherein the multi-layer strained channel has a compressive strain ranging from 100 MPa to 2000 MPa.

5. The finFET of claim 2, wherein the source and drain extension regions of the fin structure are doped to an n-type conductivity, the first semiconductor material is silicon, and the second semiconductor material is silicon doped with carbon (Si:C).

6. The finFET of claim 5, wherein the multi-layer strained channel has a tensile strain ranging from 100 MPa to 1500 MPa.

7. The finFET of claim 1, further comprising source and drain regions present on source and drain extension regions.

8. The finFET of claim 7, wherein the source and drain regions comprises silicon, silicon germanium or silicon doped with carbon.

9. The finFET of claim 7, wherein the source and drain regions comprise dopants having a conductivity the same as the source and drain extension regions.

10. The finFET of claim 1, further comprising a dielectric fin cap present on top surfaces of the fin structure and the epitaxially grown semiconductor layer.

11. The finFET of claim 10, wherein the dielectric fin cap has a width equal to the first width.

12. The finFET of claim 10, wherein the functional gate structure overlies the dielectric fin cap.

13. The finFET of claim 12, wherein the functional gate structure comprises at least one gate dielectric that is in direct contact with the epitaxially grown semiconductor layer and at least one gate conductor present on the at least one gate dielectric.

14. The finFET of claim 13, further comprising a gate dielectric cap present on an upper surface of the at least one gate conductor.

15. The finFET of claim 7, further comprising an interlevel dielectric layer overlying the source/drain regions, the interlevel dielectric layer having an upper surface coplanar with a topmost surface of the functional gate structure.

16. The finFET of claim 1, wherein the substrate comprises a dielectric layer.

17. A fin field effect transistor (finFET) comprising:
a fin structure of a first semiconductor material located on a substrate, the fin structure comprising a channel portion and source and drain extension regions separated from one another by the channel portion, wherein the source and drain extension regions have a first width and the channel portion has a second width smaller than the first width;
an epitaxially grown semiconductor layer of a second semiconductor material present on sidewalls of the channel portion, wherein the epitaxially grown semiconductor layer has a thickness that is the first width less the second width, and the second semiconductor material has a different lattice dimension than the first semiconductor material;
a dielectric fin cap present on top surfaces of the fin structure and the epitaxially grown semiconductor layer, wherein the dielectric fin cap has a width equal to the first width; and
a functional gate structure straddling the channel portion of the fin structure and in contact with sidewalls of the epitaxially grown semiconductor layer and a top surface of the dielectric fin cap.

* * * * *